(12) United States Patent
Ohkawa et al.

(10) Patent No.: US 9,252,624 B2
(45) Date of Patent: Feb. 2, 2016

(54) BATTERY CONTROL DEVICE AND BATTERY SYSTEM

(75) Inventors: Keiichiro Ohkawa, Hitachinaka (JP); Ryouhei Nakao, Tokyo (JP); Youhei Kawahara, Tokyo (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 252 days.

(21) Appl. No.: 14/124,590

(22) PCT Filed: Jun. 10, 2011

(86) PCT No.: PCT/JP2011/063358
§ 371 (c)(1),
(2), (4) Date: Dec. 6, 2013

(87) PCT Pub. No.: WO2012/169063
PCT Pub. Date: Dec. 13, 2012

(65) Prior Publication Data
US 2014/0111164 A1    Apr. 24, 2014

(51) Int. Cl.
*H02J 7/14* (2006.01)
*H02J 7/00* (2006.01)
(Continued)

(52) U.S. Cl.
CPC ............... *H02J 7/007* (2013.01); *B60L 11/005* (2013.01); *B60L 11/14* (2013.01); *B60L 11/1803* (2013.01); *B60L 11/1816* (2013.01); *B60L 11/1857* (2013.01); *B60L 11/1862* (2013.01); *B60L 11/1864* (2013.01); *G01R 31/3606* (2013.01); *H01M 10/441* (2013.01); *H01M 10/482* (2013.01); *H02J 7/045* (2013.01); *H02J 7/047* (2013.01); *H02J 7/14* (2013.01); *B60L 2210/40* (2013.01); *B60L 2240/545* (2013.01);

(Continued)

(58) Field of Classification Search
CPC .... H02J 7/14; H01M 10/441; Y02T 10/7055; Y02T 10/7077; G01R 31/3606
USPC ........... 320/104, 132, 134, 152, 165; 903/903
See application file for complete search history.

(56) References Cited

U.S. PATENT DOCUMENTS

| 5,202,617 A * | 4/1993 | Nor ........................... B60L 3/12 320/109 |
| 2007/0013347 A1* | 1/2007 | Kamohara ............... B60K 6/48 320/160 |

(Continued)

FOREIGN PATENT DOCUMENTS

| JP | 2007-157348 A | 6/2007 |
| JP | 2007-165211 A | 6/2007 |

(Continued)

*Primary Examiner* — Edward Tso
*Assistant Examiner* — Aaron Piggush
(74) *Attorney, Agent, or Firm* — Volpe and Koenig, P.C.

(57) ABSTRACT

An object of the invention is to provide a battery control apparatus capable of accurately obtaining permissible charging or discharging power in keeping with variation of the internal resistance of a battery. The battery control apparatus of this invention includes an internal resistance table in which the internal resistance value of single cells corresponding to the temperature and state of charge thereof are described in association with each of charging or discharging duration time of the single cells. The battery control apparatus calculates a permissible charging current or a permissible discharging current by using the internal resistance value described in the internal resistance table and controls the charging or discharging of the single cells in accordance with the current value thus obtained.

9 Claims, 8 Drawing Sheets (51) Int. Cl.
*H01M 10/44* (2006.01)
*H01M 10/48* (2006.01)
*B60L 11/00* (2006.01)
*B60L 11/14* (2006.01)
*B60L 11/18* (2006.01)
*G01R 31/36* (2006.01)
*H02J 7/04* (2006.01)

(52) U.S. Cl.
CPC ...... *B60L2240/547* (2013.01); *B60L 2240/549* (2013.01); *G01R 31/3658* (2013.01); *G01R 31/3662* (2013.01); *Y02T 10/70* (2013.01); *Y02T 10/7005* (2013.01); *Y02T 10/7022* (2013.01); *Y02T 10/7044* (2013.01); *Y02T 10/7061* (2013.01); *Y02T 10/7077* (2013.01); *Y02T 10/7241* (2013.01); *Y02T 90/127* (2013.01); *Y02T 90/14* (2013.01)

(56) References Cited

U.S. PATENT DOCUMENTS

| | | |
|---|---|---|
| 2007/0120537 A1 | 5/2007 | Yamamoto |
| 2007/0145954 A1 | 6/2007 | Kawahara et al. |
| 2008/0156551 A1 | 7/2008 | Kawahara et al. |
| 2010/0019729 A1 | 1/2010 | Kaita et al. |

FOREIGN PATENT DOCUMENTS

| | | |
|---|---|---|
| JP | 2008-104289 A | 5/2008 |
| JP | 2008-118790 A | 5/2008 |
| JP | 2008-312391 A | 12/2008 |
| JP | 2010-035280 A | 2/2010 |
| JP | 2012-110221 A | 6/2012 |

\* cited by examiner

BATTERY CONTROL DEVICE AND BATTERY SYSTEM

TECHNICAL FIELD

The present invention relates to a technique for controlling a battery.

BACKGROUND ART

Electrically powered vehicles are mounted with storage batteries such as lead-acid batteries, nickel metal hydride batteries, and lithium-ion batteries. The power needed by hybrid vehicles or electric cars for traveling is provided by these batteries.

A storage battery mounted on the vehicle is used in a wide temperature range and has maximum permissible power commensurate with the temperature of the storage battery. If the storage battery is charged or discharged in excess of the maximum permissible power, it could be overcharged or overdischarged.

A storage battery generally has small maximum permissible power at a low temperature and large maximum permissible power at a high temperature. In spite of the large maximum permissible power at the high temperature, the use of the storage battery in the high-temperature state promotes its deterioration. Meanwhile, as the state of charge (SOC) of a storage battery becomes higher, its maximum permissible charging power becomes smaller, and its maximum permissible discharging power becomes larger; as the SOC of the storage battery becomes lower, its maximum permissible discharging power becomes lower, and its maximum permissible charging power becomes larger. To use the storage battery safely requires performing its charging and discharging control within a range of its maximum permissible power.

Patent Literature 1 cited below discloses a technique of calculating the permissible discharging power suitable for each single cell in order to perform optimum charging and discharging control even when the single cells making up a battery pack are subject to temperature variation.

CITATION LIST

Patent Literature

Patent Literature 1: JP Patent Publication (Kokai) 2007-165211 A

SUMMARY OF INVENTION

Technical Problem

According to the technique described in the above-cited Patent Literature 1, the accuracy in calculating the permissible charging and discharging power could drop if the internal resistance of the storage battery varies with the charging or discharging duration time.

The present invention has been made with a view to solving the above and other problems and provides a battery control device capable of accurately obtaining the permissible charging and discharging power of batteries while keeping with their varying internal resistance.

Solution to Problem

A battery control device according to the present invention comprises an internal resistance table in which an internal resistance value of the single cell commensurate with its temperature and state of charge is described for each value of the charging or discharging duration time of the single cell. The battery control device calculates a maximum permissible charging or discharging current of each single cell by using the internal resistance value described in the internal resistance table. By use of the maximum permissible charging or discharging current calculated in accordance with the calculated current value, the battery control device controls charging or discharging of each single cell.

Advantageous Effects of Invention

Even if the internal resistance of the single cell changes during its charging or discharging duration time, the battery control device of the present invention switches the internal resistance value acquired from the internal resistance table according to the change, thereby following up on the internal resistance variation. This makes it possible to obtain the permissible charging or discharging power accurately.

DESCRIPTION OF EMBODIMENTS

Some embodiments of the present invention are explained below with reference to the accompanying drawings. In the ensuing explanation of the embodiments, the present invention is applied to a battery system included in the power supply of a plug-in hybrid electric vehicle (PHEV).

Also in the ensuing explanation of the embodiments, a lithium-ion battery is adopted, but a nickel metal hydride battery, a lead-acid battery, or a hybrid capacitor may be used instead. In the ensuing explanation of the embodiments, single cells are connected in series to make up a battery pack, but single cells connected in parallel may in turn be connected in series to make up the battery pack. Single cells connected in series may be connected in parallel to make up the battery pack as well.

First Embodiment

System Configuration

Figure 1:
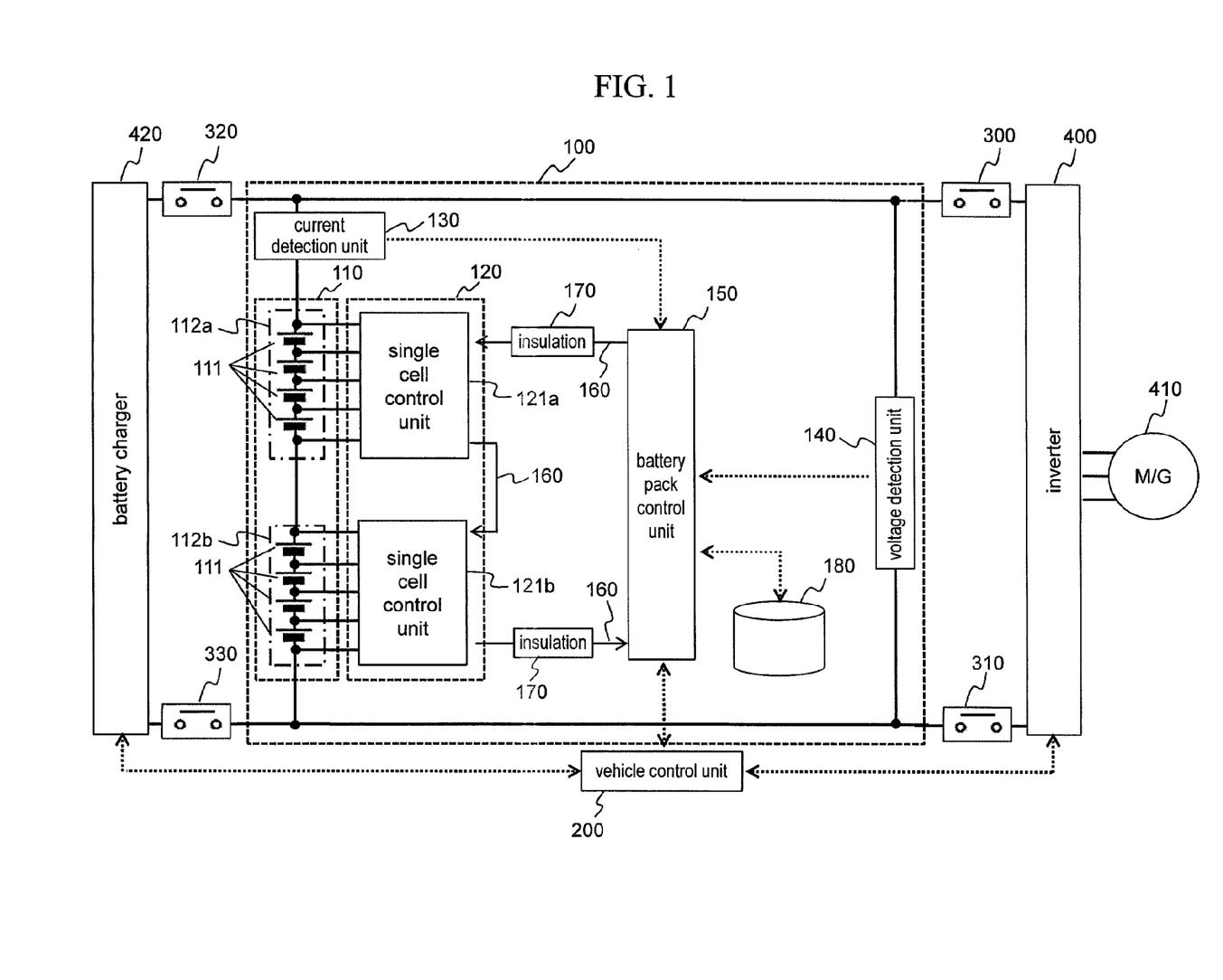
FIG. 1 is a chart showing a configuration of a battery system 100 and its surroundings according to a first embodiment of the invention.

FIG. 1 is a chart showing a configuration of a battery system 100 and its surroundings according to the first embodiment of the invention. The battery system 100 is connected to an inverter 400 via relays (300, 310) and is coupled to a battery charger 420 via relays (320, 330). The battery system 100 includes a battery pack 110, a single cell management unit 120, a current detection unit 130, a voltage detection unit 140, a battery pack control unit 150, and a storage unit 180.

The battery pack 110 is made up of a plurality of single cells 111. The single cell management unit 120 monitors the status of the single cells 111. The current detection unit 130 detects current flowing through the battery system 100. The voltage detection unit 140 detects the total voltage of the battery pack 110. The battery pack control unit 150 controls the battery pack 110.

The battery pack control unit 150 receives the cell voltage and temperature of the single cells 111 transmitted from the single cell management unit 120, the current value in the battery system 100 transmitted from the current detection unit 130, and the total voltage of the battery pack 110 transmitted from the voltage detection unit 140. Based on the information thus received, the battery pack control unit 150 detects the status of the battery pack 110. A result of status detection by the battery pack control unit 150 is transmitted to the single cell management unit 120 and a vehicle control unit 200.

The battery pack 110 is configured by a plurality of single cells 111 capable of storing and delivering electric energy (i.e., charging and discharging DC power) connected electrically in series. The single cells 111 making up the battery pack 110 are divided into groups of a predetermined cell count. The grouped single cells 111 are electrically connected in series to form single cell groups (112a, 112b). The number of the single cells making up a given single cell group 112 may be the same for all groups 112 or may be different from one group 112 to another.

The single cell management unit 120 monitors the status of the single cells 111 included in the battery pack 110. The single cell management unit 120 includes a single cell control unit 121 provided for each of the single cell groups 112. In FIG. 1, the single cell control units (121a, 121b) are installed corresponding to the single cell groups (112a, 112b), respectively. The single cell control units 121 monitor and control the status of the single cells making up the single cell groups 112.

For purpose of simplification and illustration, it is assumed that the first embodiment has four single cells 111 electrically connected in series to make up each of the single cell groups (112a and 112b), and that the single cell groups (112a and 112b) are further connected electrically in series to configure the battery pack 110 composed of a total of eight single cells 111.

The battery pack control unit 150 and the single cell management unit 120 transmit/receive a signal each other via an insulating element 170 typified by photo couplers and a signal communication means 160.

What follows is an explanation of the communication means interposed between the battery pack control unit 150 and the single cell control units (121a, 121b) included in the single cell management unit 120. The single cell control units (121a, 121b) are respectively connected in series in descending order of the potential to the single cell groups (112a, 112b) that the single cell control units monitor, respectively. The signal transmitted to the single cell management unit 120 from the battery pack control unit 150 is input to the single cell control unit 121a via the insulating element 170 and signal communication means 160. The output of the single cell control unit 121a is input to the single cell control unit 121b via the signal communication means 160, and the output of the single cell control unit 121b of the lowest potential is transmitted to the battery pack control unit 150 via the insulating elements 170 and signal communication means 160. In the first embodiment, the signal may be transmitted/received between the single cell control units (121a, 121b) via the insulating element 170 which, however, are not directly interposed therebetween.

The storage unit 180 stores information such as the internal resistance characteristic, capacity in a fully charged state, polarization voltage, deterioration characteristic, individual difference information, and correspondence relation between the SOC and an open circuit voltage (OCV) regarding the battery pack 110, single cells 111, and single cell groups 112. Furthermore, the storage unit 180 may store beforehand characteristic information about the single cell management unit 120, single cell control units 121, and battery pack control unit 150. The information stored in the storage unit 180 will be discussed later with reference to FIGS. 3 and 4.

The battery pack control unit 150 performs a calculation to control the SOC, the state of health (SOH), chargeable/dischargeable current and power (of which the value will be positive on the charging side and negative on the discharging side in the ensuing description), abnormal state, and amounts of charge and discharge regarding at least one single cell 111 by using the information received from the single cell management unit 120, current detection unit 130, voltage detection unit 140, vehicle control unit 200, an SOC table 181, and an internal resistance table 182 (both tables will be discussed later). Based on the result of the calculation, the battery pack control unit 150 outputs information to the single cell management unit 120 and vehicle control unit 200.

The vehicle control unit 200 controls an inverter 400 connected to the battery system 100 via the relays (300, 310) by using the information transmitted from the battery pack control unit 150. The vehicle control unit 200 also controls the battery charger 420 connected to the battery system 100 via the relays (320, 330). While the vehicle is traveling, the battery system 100 is connected to the inverter 400 and drives a motor generator 410 by using the energy stored in the battery pack 110. At the time of charging, the battery system 100 is connected to the battery charger 420 and is charged therethrough with power supplied from a household wall socket or a charging station.

The battery charger 420 is used for charging the battery pack 110 by an external power source typified by the household wall socket or the charging station. In the first embodiment, the battery charger 420 is configured to control the charging voltage and charging current in accordance with a command from the vehicle control unit 200. Alternatively, the battery charger 420 may perform the control based on a command from the battery pack control unit 150. Also, the battery charger 420 may be installed either inside or outside the vehicle depending on the vehicle structure, the performance and intended use of the charger 420, and installation condition of external power sources.

When a vehicle system mounted with the battery system 100 travels, the battery system 100 under management of the vehicle control unit 200 is connected to the inverter 400 so that the motor generator 410 is driven by the energy stored in the battery pack 110. At the time of regeneration, the battery pack 110 is charged with power regenerated by the motor generator 410. When the vehicle equipped with the battery system 100 is connected to an external power source typified by the household wall socket or the charging station, the battery system 100 is connected to the battery charger 420 based on the information transmitted from the vehicle control unit 200 so that the battery system 100 is charged until a predetermined conditions is met. The energy accumulated in the battery pack 110 through charging is used for driving the vehicle next time or for operating electric components inside or outside the vehicle. Further, the energy in the battery pack 110 may be delivered as needed to an external power source typified by the household wall socket.

Figure 2:
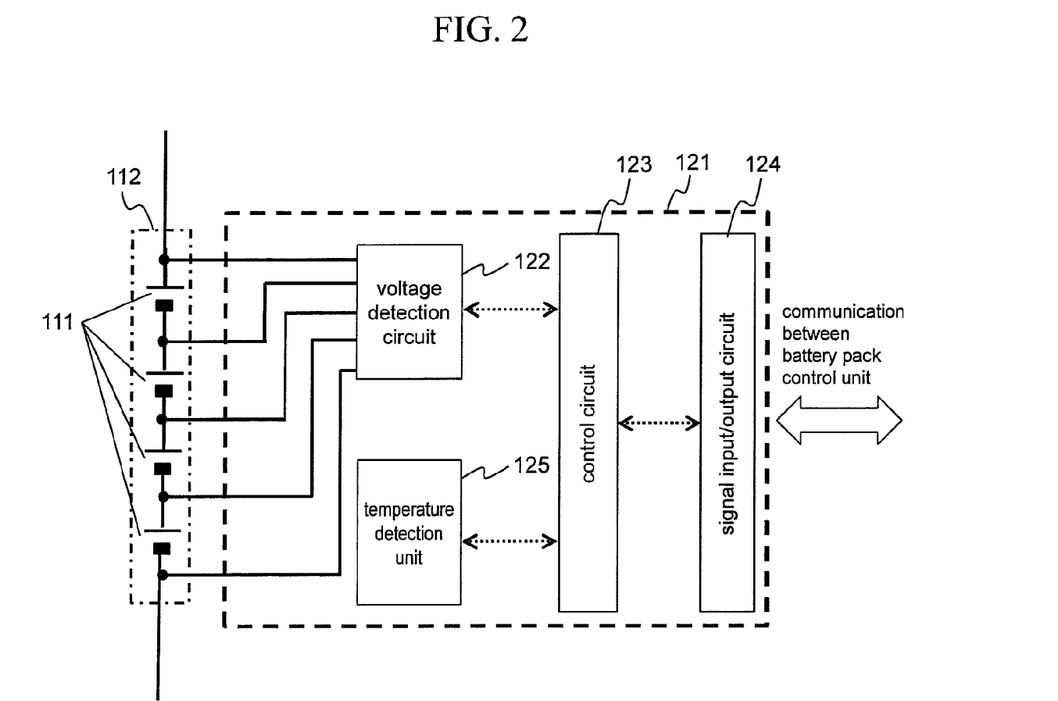
FIG. 2 is a chart showing a circuit structure of a single cell control unit 121.

FIG. 2 is a chart showing a circuit structure of the single cell control unit 121. The single cell control unit 121 includes a voltage detection circuit 122, a control circuit 123, a signal input/output circuit 124, and a temperature detection unit 125. The voltage detection circuit 122 detects voltage between the terminals of the single cells 111. The control circuit 123 receives the result of the detection from the voltage detection circuit 122 and temperature detection unit 125 and transmits the received result to the battery pack control unit 150 via the signal input/output circuit 124. Incidentally, the circuit structure for equalizing varying voltage between the single cells 111 or SOC variation attributable to self-discharge and consumption current variation is considered to be well known and thus will not be described hereunder.

The temperature detection unit 125 included in the single cell control unit 121 shown in FIG. 2 has functionality to measure the temperature of the single cell groups 112. The temperature detection unit 125 measures one temperature representative of all single cell groups 112 and handles the measured temperature as a representative temperature of the single cells 111 included in the single cell groups 112. The temperature measured by the temperature detection unit 125 is used in various calculations for detecting the status of single cells 111, single cell groups 112, or battery pack 110. Because the above functionality is assumed to be provided in FIG. 2, the single cell control unit 121 has one temperature detection unit 125. Although it is possible to provide a temperature detection unit 125 for each of the single cells 111, to measure the temperature of each single cell 111, and to perform various calculations based on the measured temperature of the individual single cells 111, such arrangements will make the structure of the single cell control unit 121 complicated with many temperature detection units 125.

FIG. 2 schematically shows the temperature detection unit 125. In practice, a temperature sensor is installed to cover the target to be measured for temperature. The installed temperature sensor outputs temperature information as voltage that is measured. The result of the measurement is transmitted to the signal input/output circuit 124 via the control circuit 123 which in turn outputs the result outside of the single cell control unit 121. The function of implementing this series of operations is provided in the form of the temperature detection unit 125 inside the single cell control unit 121. The voltage detection circuit 122 may be used instead to measure the temperature information (voltage).

Figure 3:
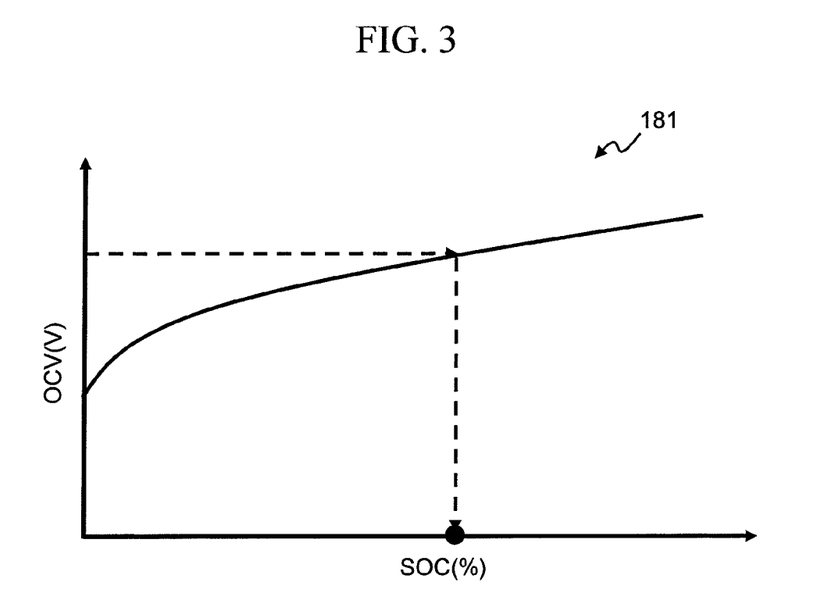
FIG. 3 is a chart showing a typical SOC table 181 stored in a storage unit 180.

FIG. 3 is a chart showing a typical SOC table 181 stored in the storage unit 180. The SOC table 181 is a data table that describes the correspondence relations between the OCV's and SOC's of the single cells 111. Although any suitable data format may be used, typical data is shown here in graphic form for purpose of explanation. Although this embodiment uses the data table to represent the correspondence relation between the OCV's and the SOC's, mathematical expressions or the like may be used instead for the purpose. Any means may be used as long as it provides characteristic information representative of the correspondence relation between the OCV's and the SOC's and permits conversion from OCV to SOC or vice versa.

The OCV is the voltage in effect when the single cells 111 are under no load. The voltage measured between the terminals of each single cell 111 before the relays (300, 310, 320, 330) are closed, or when the relays (300, 310, 320, 330) are closed but the charging or discharging of the battery pack 110 has yet to be started is considered to be the OCV. Furthermore, the OCV may also be recognized when the battery pack 110 is being charged or discharged but the current value stemming therefrom is very small.

If the value of the current flowing to/from the single cells 111 is large, the internal resistance of the single cells 111 causes a non-negligible drop/rise in voltage. The battery voltage at this point is a closed circuit voltage (CCV). Under this condition, it is difficult for the single cell control unit 121 directly to acquire the OCV of the single cells 111. To acquire the OCV in this case requires that the battery pack control unit 150 calculates the OCV from the expression (1) shown below by using the CCV of the single cells 111 measured by the single cell control unit 121, the current I flowing to/from the single cell 111 and measured by the current detection unit 130, and the information about the internal resistance R and the polarization voltage Vp of the single cells 111 stored beforehand. The OCV thus obtained is input to the table in FIG. 3 to acquire the SOC at the point.

The calculation with the expression (1) below may be performed by the battery pack control unit 150 regardless of whether the single cells are being charged or discharged. The SOC of each single cell 111 is calculated using, for example, the OCV of each of the single cells 111 making up the battery pack 110.

Another known method of calculating the SOC includes integrating the current flowing to/from the single cells 111 (SOC=initial SOC+100×∫Idt/fully charged capacity). Any of these SOC calculation methods may be adopted for this embodiment. Alternatively, some other method may be used by the battery pack control unit 150 in obtaining the SOC of each of the single cells 111.

If the SOC calculation method above is adopted to obtain the SOC of each single cell 111 by using the CCV, R, and Vp in the expression (1) below and by integrating the above-mentioned current, then the initial SOC and the fully charged capacity need to be prepared beforehand for each single cell 111 as a calculation parameter.

$$OCV = CCV - I \times R - Vp \quad \text{(Exp. 1)}$$

The battery pack control unit 150 can obtain the SOC of the single cells 111 using the SOC table and the OCV of the single cells 111 detected by the single cell control unit 121. Also, the OCV of the battery pack 110 may be acquired by adding up the OCV of the single cells 111. If the SOC characteristic differs from one single cell 111 to another, the SOC table 181 may be provided for each of the single cells 111.

Figure 4:
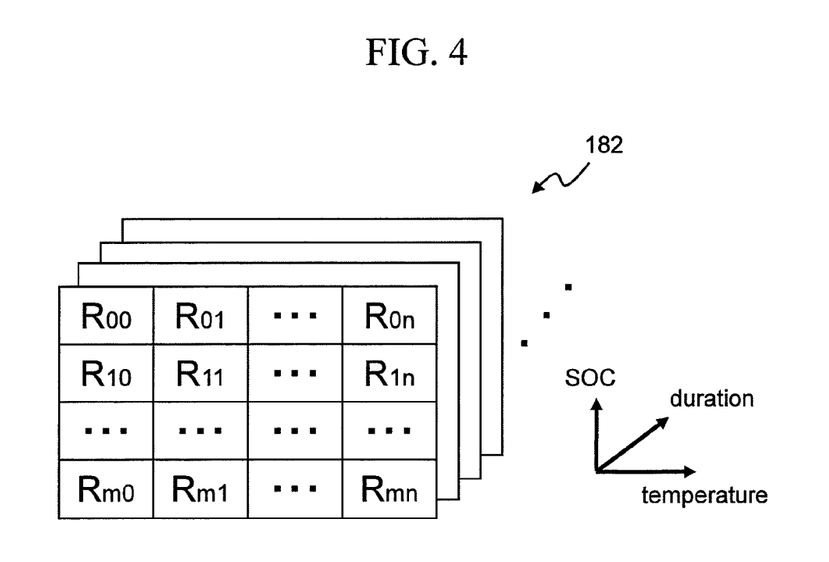
FIG. 4 is a chart showing a typical internal resistance table 182 stored in the storage unit 180.

FIG. 4 is a chart showing a typical internal resistance table 182 stored in the storage unit 180. The internal resistance table 182 is a data table where the internal resistance value corresponding to the temperature and the SOC of the single cells 111 are associated with the charging duration time. Although any data format may be used for the internal resistance table 182, what is shown here for purpose of explanation is a plurality of two-dimensional maps describing the internal resistance value R of the single cells 111 in chronological order of charging duration, each of the maps having the horizontal axis representing the temperature of the single cells 111 and the vertical axis denoting the SOC of the single cells 111. Although this embodiment adopts the data table, it is also possible, as with the SOC table 181 in FIG. 3, to use a different means such as mathematical expressions to represent the correspondence relation between the temperature, SOC, and the charging duration time on one hand and the internal resistance on the other hand. Any suitable characteristic information about the internal resistance may be adopted as long as it corresponds to the temperature, SOC, and the charging duration time of the cells.

The battery pack control unit 150 acquires the internal resistance value of the single cells 11 by referencing the internal resistance table 182 using the SOC obtained in the above-described manner and the representative temperature of the single cell groups 112 acquired by the single cell control unit 121. Further, by designating the charging duration time of the single cells 111, the battery pack control unit 150 can obtain the internal resistance value at intervals of the designated charging duration time.

The time intervals at which the two-dimensional maps of the internal resistance table 182 per charging duration time are provided may be determined suitably in accordance with, say, the specifications of the battery system 100. For example, the two-dimensional map shown in FIG. 4 may be provided at intervals of the charging duration time of one second.

The foregoing paragraphs have discussed the configuration of the battery system 100. Described below are the basic concept and the procedure of operating the battery system 100.

First Embodiment

Concept of System Operation

The internal resistance value of a given single cell 111 varies with the temperature and SOC of that single cell 111. The temperature of the single cell 111 may be obtained by the single cell control unit 121, and the SOC of the single cell 111 may be acquired using the above-described method. By use of these values, the battery pack control unit 150 obtains the internal resistance value of the single cell 111 and determines a suitable permissible charging current accordingly.

It should be noted that the internal resistance value of the single cell 111 also varies with the charging duration time. With this embodiment, the internal resistance table 182 is thus provided for each charging duration time so that a more accurate internal resistance value of the single cell 111 may be obtained. This helps acquire the permissible charging current more accurately.

Incidentally, there occurs temperature variation between the single cells 111 making up the battery pack 110. The internal resistance value of the single cells 111 is different between the time when the temperature is at the lowest and the time when the temperature is at the highest, which can affect the permissible current value. In view of that possibility, at least two temperature measurements taken by at least two single cell control units 121 are used to obtain the highest and lowest temperatures of the battery pack 110. The permissible current corresponding to the highest and lowest temperatures of the battery pack 110 is then calculated, and the smaller of the two permissible current is adopted as the definitive permissible current value.

Figure 5:
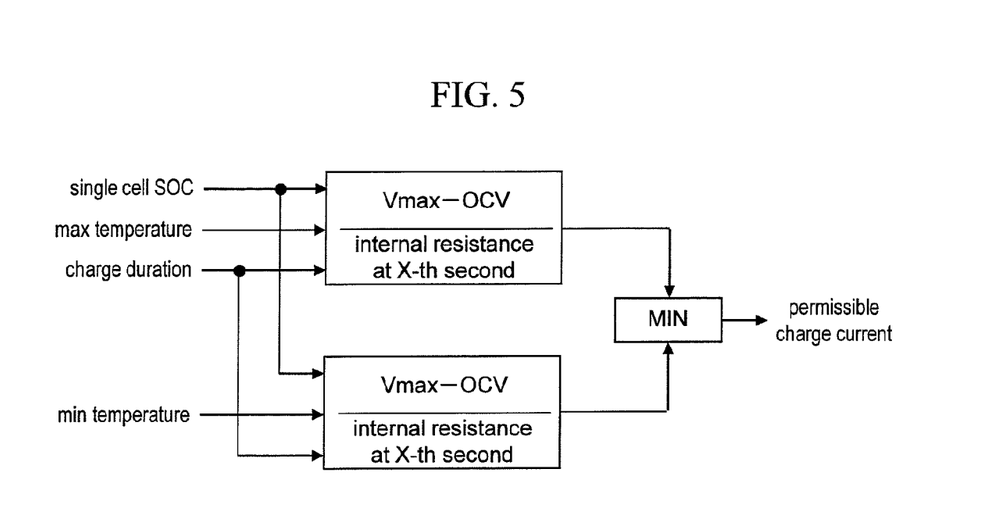
FIG. 5 is a chart showing in control blocks the method whereby a battery pack control unit 150 configured in the battery system 100 obtains a permissible charging current of each single cell 111.

FIG. 5 is a chart showing in control blocks the method whereby the battery pack control unit 150 configured in the battery system 100 obtains the permissible charging current of each single cell 111. If the maximum permissible terminal voltage of the single cell 111 is represented by Vmax, the permissible charging current may be obtained from the expression (2) shown below. The OCV in the expression (2) below may be appropriated from the result of the calculation with the expression (1) above. If the SOC is acquired by integrating the current flowing to/from the single cell 111, the result of the calculation of the SOC may be converted to the corresponding OCV, which may be used for (2) as well, by the SOC table 181 in FIG. 3. In the example of FIG. 5, the SOC of a single cell 111 is shown to be input.

$$\text{Permissible charging current} = (V\text{max} - OCV)/\text{internal resistance value} \quad (2)$$

The permissible charging current above is obtained regarding the highest and lowest temperatures of the single cell 111, and the smaller of the two permissible charging current values thus obtained is definitively adopted.

Figure 6:
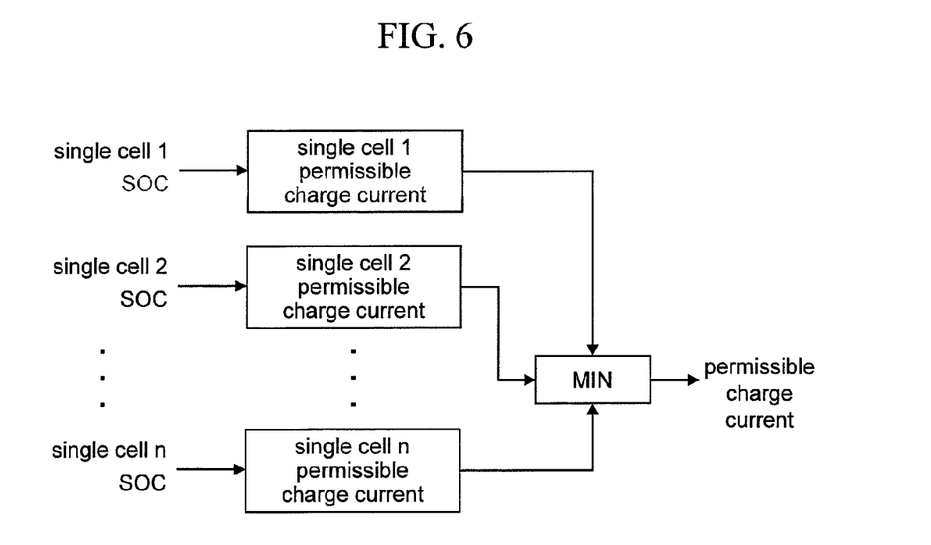
FIG. 6 is a chart showing in control blocks the method whereby the battery pack control unit 150 configured in the battery system 100 obtains the permissible charging current of a battery pack 110.

FIG. 6 is a chart showing in control blocks the method whereby the battery pack control unit 150 configured in the battery system 100 obtains the permissible charging current of the battery pack 110. Besides using the method explained in connection with FIG. 5, the battery pack control unit 150 inputs the SOC of each single cell 111 to calculate the permissible charging current for each single cell 111, and thereafter adopts the smallest charging current as the definitive permissible charging current. Since the same current flows through all the single cells 111 connected in series, adopting the smallest permissible charging current of each single cell 111 implements charging control in such a manner that the voltages of all single cells 111 does not exceed Vmax.

The permissible charging current definitively determined for the battery pack 110 is used to calculate the battery pack charging voltage at the time of charging. Multiplying the permissible charging current by the battery pack charging voltage makes it possible to calculate the permissible charging power for the battery pack 110.

The battery pack charging voltage is the total voltage of the battery pack 111 expected to develop when the definitively determined permissible charging current is applied. The battery pack charging voltage may be obtained by adding up the voltage of the individual single cells 111 charged with the permissible charging current acquired by inputting the SOC and temperature regarding each of the single cells 111 making up the battery pack 110. Alternatively, the average voltage of the single cells 111 charged with the permissible charging current obtained by inputting the average SOC and the average temperature regarding the single cells 111 making up the battery pack 110 may be multiplied by the number of the serially connected single cells to obtain the battery pack charging voltage.

Although either the method above of calculating the total voltage value by acquiring the voltage of the individual single cells 111 or the method above of multiplying the average voltage of the single cells 111 by the number of the serially connected single cells may be adopted, this embodiment adopts the latter method. The method is further explained hereunder using the expression (3) below.

The average OCV in the expression (3) below is obtained as an average of the result of the calculation with the expression (1) above regarding each of the single cells 111, or acquired as an average OCV derived through conversion from the average SOC of the integrated current of the individual single cells 111 by using the SOC table 181 in FIG. 3. The average internal resistance value in the expression (3) below is obtained by inputting to the internal resistance table 182 in FIG. 4 an average of the SOC of the individual single cells 111 or of the integrated current thereof acquired using the expression (1) and FIG. 3, an average of a plurality of temperatures measured from the battery pack 110, and the charging duration time in effect.

> Battery pack charging current=serially connected single cell count×(average $OCV$+permissible charging current×average internal resistance value) (3)
>
> Permissible charging power=permissible charging current×battery pack charging voltage (4)

Figure 7:
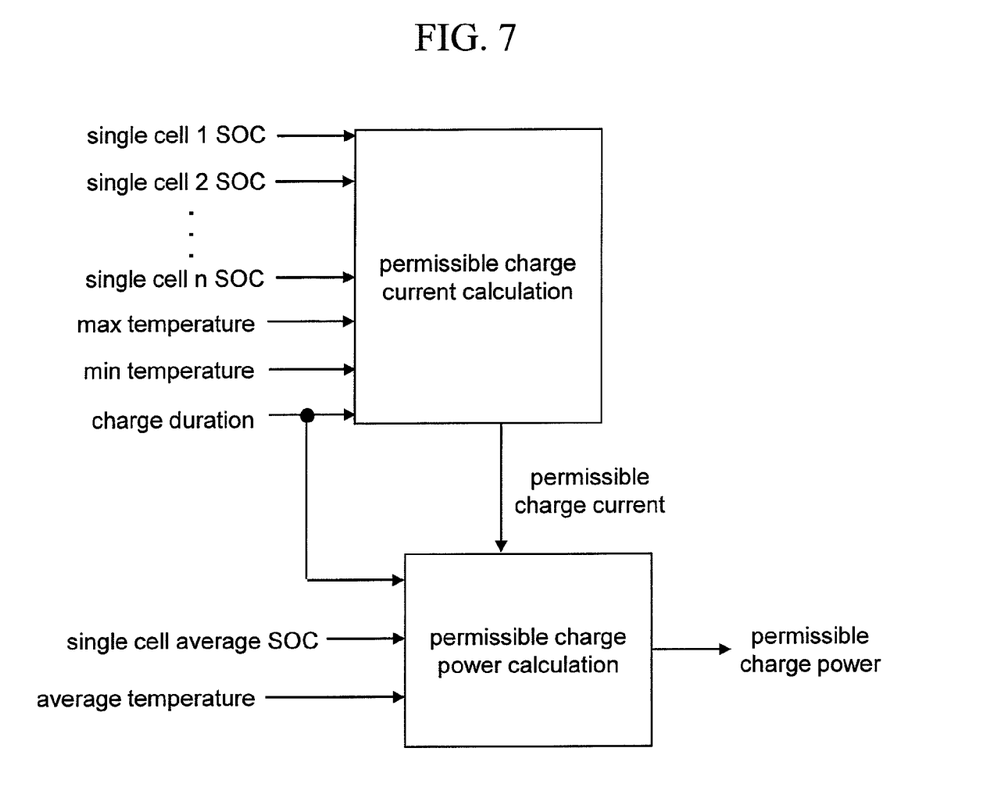
FIG. 7 is a chart showing in control blocks the method whereby the battery pack control unit 150 configured in the battery system 100 obtains the permissible charging power of the battery pack 110.

FIG. 7 shows an image of the process carried out to calculate the permissible charging current and permissible charging power from the above-mentioned input parameters.

The battery pack control unit 150 performs the above-described series of calculations up to acquiring the permissible charging power and transmits the result of the calculations to the vehicle control unit 200. In turn, the vehicle control unit 200 transmits commands to the inverter 40 and other relevant components so as to charge the battery pack 110 within the range of the permissible charging power received. In this manner, the battery pack 110 can be charged in such a manner that none of the single cells 111 included in the battery pack 110 exceeds Vmax.

First Embodiment

Operating Procedure of the System

Explained below is the procedure of operating the battery system 100 in charging the single cells 111 so that the charging power for each single cell 111 falls within the permissible range.

(Step 1: Acquire the OCV of the Single Cells 111)

Using the result of the measurement from the single cell management unit 120 and others, the battery pack control unit 150 obtains the OCV of each single cell 111. If the single cells 111 are under no load, the voltage measured by the single cell management unit 120 may be treated as the OCV.

(Step 2: Acquire the SOC of the Single Cells 111)

The battery pack control unit 150 acquires the SOC of each single cell 111 by using the SOC table 181 and the OCV of each single cell 111 acquired in step 1. Where the SOC calculation method above of integrating the current flowing to/from the single cells 111 is adopted, the current values measured by the current detection unit 130 are integrated to provide the SOC. Further, being preparatory to calculating the permissible power, the average OCV may be calculated from the OCV's of the single cells 111 explained in step 1, or the average of the SOC obtained here may be converted to the corresponding average OCV by using the SOC table 181 in FIG. 3.

(Step 3: Acquire the Temperature of the Single Cells 111)

The battery pack control unit 150 uses the single cell control unit 121 installed for each of the single cell groups 112 to acquire the temperature of at least two single cell groups 112.

If each single cell 111 is furnished with the temperature detection unit 125, the temperature of each single cell 11 is acquired. From at least two temperatures thus obtained, the highest and lowest temperatures are acquired preparatory to calculating the permissible current, and the average temperature is obtained preparatory to calculating the permissible power.

(Step 4: Acquire the Charging Duration Time)

The battery pack control unit 150 acquires the time during which the single cells 111 are charged. For example, the counting of the duration time starts when the single cells 111 start to be charged, and the count keeps increasing as long as charging continues. The result of the counting is used as the charging duration time.

(Step 5: Acquire the Internal Resistance Value Corresponding to the Charging Duration Time)

The battery pack control unit 150 references the internal resistance table 182 by using the SOC, temperature, and the charging duration time of the single cells 111 acquired in steps 2 through 4 above, thereby obtaining the corresponding internal resistance value.

(Step 6: Acquire the Permissible Charging Current of the Single Cells 111)

The battery pack control unit 150 obtains the permissible charging current of the single cells 111 using the methods explained above in reference to FIGS. 5 and 6.

(Step 7: Acquire the Permissible Charging Power)

The battery pack control unit 150 obtains the permissible charging power by performing the calculations of the expressions (3) and (4) above using the permissible charging current acquired in step 6 as their input. If the vehicle control unit 200 has functionality to obtain the permissible charging power, the battery pack control unit 150 may obtain relevant data up to the permissible charging current and may transmit the current thus acquired to the vehicle control unit 200. Given the permissible charging current, the vehicle control unit 200 may calculate the permissible charging power. The vehicle control unit 200 performs calculations and processes and transmits commands to the inverter 400 and battery charger 420 in such a manner that the battery pack 110 will be charged within the range of the permissible charging power received or calculated by the vehicle control unit 200 itself.

(Step 8: Repeat the Above Steps while Charging Continues)

The battery pack control unit 150 repeats steps 1 through 7 above. This makes it possible to switch internal resistance values of the single cells 111 in accordance with the charging duration time and to obtain the permissible charging power by always using an optimal permissible charging current in implementing charging control.

First Embodiment

Conclusion

As described above, the battery system 100 of the first embodiment includes the internal resistance table 182 composed of two-dimensional maps which are provided per charging duration time and which describe the internal resistance values corresponding to the temperature and SOC of the single cells 111. The battery system 100 obtains the internal resistance value of the single cells 111 from the internal resistance table 182 by using the temperature, SOC, and charging duration times of the single cells 111. Based on the internal resistance value thus obtained, the battery system 100 acquires the permissible charging current for the single cells 111. In this manner, the optimal permissible charging current is obtained in accordance with the internal resistance value of the single cells 111 varying with the charging duration time, whereby charging control is implemented.

For the first embodiment, the operations for charging the single cells 111 were explained above. The same method can also be used at the timing of discharging. That is, the internal resistance table 182 may be arranged to describe internal resistance value corresponding to different discharging duration time. Whereas the charging duration time is shown to be input in FIG. 5, the discharging duration time may be input instead of the charging duration time. The upper voltage Vmax in the expression (2) may then be replaced with a lower voltage Vmin in calculating the permissible discharging current. In the same manner as in FIG. 6, the permissible discharging current of each single cell 111 is obtained, and the smallest absolute value of the current thus acquired is adopted as the definitive permissible discharge current.

Second Embodiment

The first embodiment was explained using examples in which the internal resistance value of the single cells 111 is changed depending on the charging or discharging duration time when the permissible charging or discharging current is to be obtained. Although this method is effective for such forms of operation as electric vehicles that take a relatively long time to charge and discharge, the method may not be mandatory for forms of operation such as hybrid electric vehicles that use batteries over relatively short periods of time.

The second embodiment is explained below with an example where the battery system 100 operates switchably either in an operation mode in which the system 100 supplies power to an electric vehicle or in an operation mode in which the system 100 feeds power to a hybrid electric vehicle and where the procedure for calculating the permissible charging or discharging current is switched according to operation mode switchover. Since the configuration of the battery system 100 for the second embodiment is substantially the same as that for the first embodiment, the difference between the two embodiments is primarily discussed hereunder.

Figure 8:
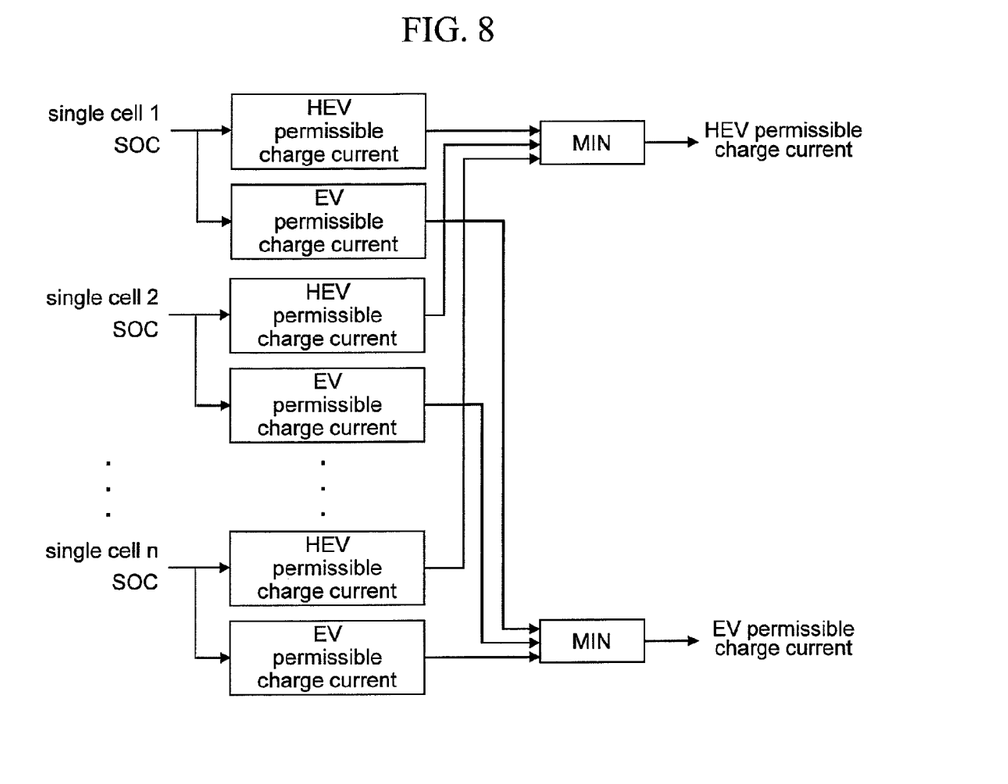
FIG. 8 is a chart showing in control blocks the method whereby the battery pack control unit 150 configured in the battery system 100 according to a second embodiment of the invention obtains the permissible charging current of the battery pack 110.

FIG. 8 is a chart showing in control blocks the method whereby the battery pack control unit 150 configured in the battery system 100 as the second embodiment of the invention obtains the permissible charging current of the battery pack 110.

Under the instruction of the vehicle control unit 200, the battery pack control unit 150 causes the battery system 100 switchably to operate either in hybrid vehicle mode (HEV mode) or in electric vehicle mode (EV mode).

When causing the battery system 100 to operate in EV mode, the battery pack control unit 150 calculates the permissible charging or discharging current by use of the methods explained above in connection with the first embodiment. Upon causing the battery system 100 to operate in HEV mode, the battery pack control unit 150 uses a fixed internal resistance value without changing the internal resistance value depending on the charging or discharging duration time. The fixed internal resistance value may be suitably determined in accordance with, say, the specifications of the battery system 100.

It should be noted that since HEV mode is an operation form involving the battery pack 110 being charged or discharged over a relatively shorter period of time than EV mode, the internal resistance value adopted to calculate the permissible current in HEV mode has a shorter charging or discharging duration time than in EV mode. The use of the internal resistance value that assumes the shorter duration time in HEV mode also applies to the calculation of permissible power to be performed following acquisition of the permissible current. In HEV mode, the calculation process of the battery pack control unit 150 is simplified because of the use of a fixed internal resistance value involving a shorter duration time than in EV mode.

The preceding paragraphs have discussed the method for switching the operation of the battery pack control unit 150 into either EV mode or HEV mode under the direction of the vehicle control unit 200. Alternatively, the battery pack control unit 150 may adopt a method whereby the permissible current or power for HEV mode is continuously calculated in parallel with the permissible current or power for EV mode. In this case, the vehicle control unit 200 receives the permissible current or power values for both HEV mode and EV mode, and uses the permissible current or power for either mode as needed to implement charging and discharging control over the battery pack 110. Also in this case, if the battery system 100 operates in HEV mode, the permissible current or power is calculated using the internal resistance value that assumes a shorter charging or discharging duration time than in the operation in EV mode.

By obtaining two sets of permissible current or power values in parallel, it is possible to grasp the permissible current or power expected in HEV mode while the vehicle is traveling in EV mode, or to acquire the permissible current or power expected in EV mode while the vehicle is traveling in HEV mode. This provides a vehicle system which, when traveling mode is switched for the vehicle, takes into account the charging and discharging performance of the battery pack 110 in effect following mode switchover as well as the traveling performance of the vehicle operating from the battery pack 110. It is also possible to bring about a vehicle system that permits verification of the vehicle performance based on the charging and discharging performance of the battery pack 110 working in two modes, whereby overall control of the vehicle is determined.

Third Embodiment

With the first and the second embodiments above, the permissible charging or discharging current may be calculated by taking the state of health (SOH) of the single cells 111 into consideration. The SOH in this context signifies the rate of increase in internal resistance due to deterioration. The value of the SOH is assumed to be 1 when the single cells 111 are brand-new and become larger as deterioration advances. Explained for the third embodiment of this invention is an operation example in which the SOH is taken into account. Any known method may be used to acquire the SOH of the single cells 111, and thus the method will not be discussed further in conjunction with the third embodiment. It should be noted, however, that the SOH is assumed here to be derived from the rate of increase in internal resistance detected per single cell 111 and applied to calculating the permissible current for each single cell 111.

Figure 9:
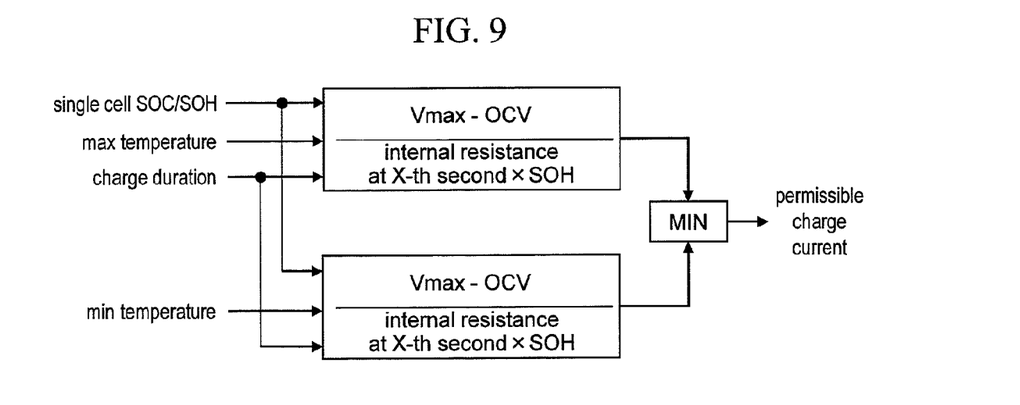
FIG. 9 is a chart showing in control blocks the method whereby the battery pack control unit 150 configured in the battery system 100 according to a third embodiment of the invention obtains the permissible charging current of each single cell 111.

FIG. 9 is a chart showing in control blocks the method whereby the battery pack control unit 150 configured in the battery system 100 as the third embodiment of the invention obtains the permissible charging current of each single cell 111. If the SOH of the single cells 111 is taken into consideration, the permissible charging current may be obtained using the following expression (5) in which Vmax represents a maximum permissible terminal voltage of the single cell 111:

Permissible charging current=($V$max−$OCV$)/(internal resistance value×$SOH$)  (Exp. 5)

The permissible charging current above is acquired at the highest and lowest temperatures of the single cells 111, and the smaller of the two currents thus obtained is adopted. The same process is carried out when the permissible discharging current is to be calculated.

Figure 10:
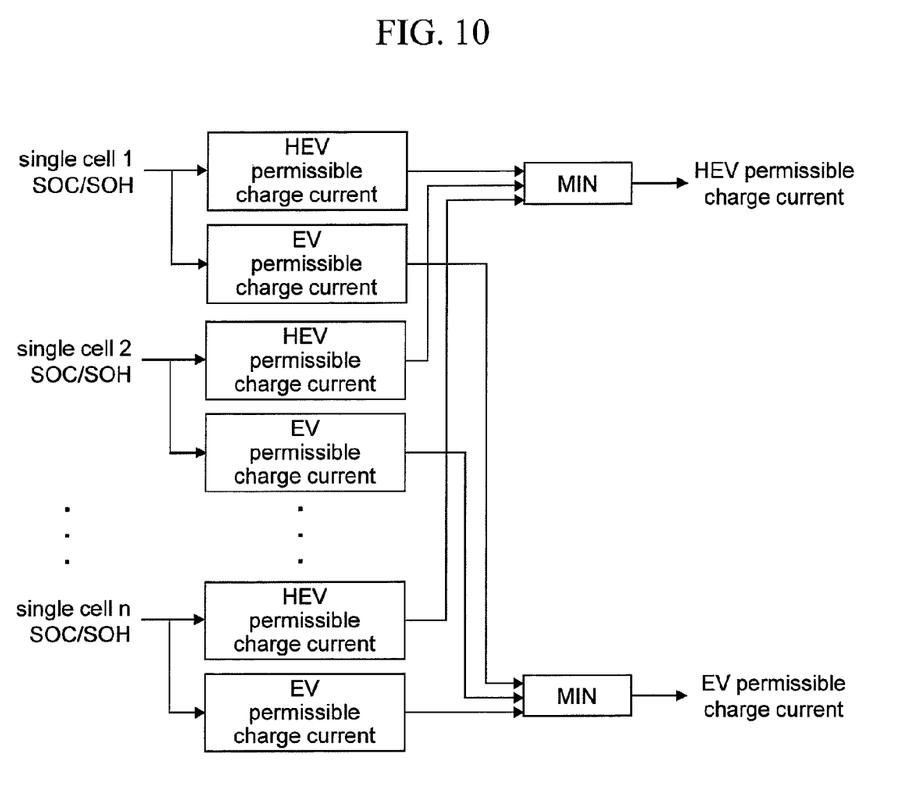
FIG. 10 is a chart showing in control blocks the method whereby the battery pack control unit 150 configured in the battery system 100 according to the third embodiment obtains the permissible charging current of the battery pack 110.

FIG. 10 is a chart showing in control blocks the method whereby the battery pack control unit 150 configured in the battery system 100 as the third embodiment obtains the permissible charging current of the battery pack 110. Because the third embodiment involves acquiring the permissible charging current with the SOH of each single cell 111 taken into account, both the SOC and the SOH of each single cell 111 are used in finding the permissible charging current thereof. The permissible current of each single cell 111 is obtained using the SOC and SOH thereof, and the smallest permissible current thus acquired is adopted. This makes it possible to perform charging and discharging control that takes into consideration the SOC and SOH of each of the single cells 111 making up the battery pack 110.

The SOH may also be taken into account when the permissible power is calculated. As described above, the battery pack charging voltage necessary for calculating the permissible charging power is obtained either by adding up the voltages in effect when each of the single cells 111 making up the battery pack 110 is supplied with the corresponding permissible current, or by multiplying the average of these voltages by the number of the serially connected single cells. If the method of first acquiring the average voltage of the single cells 111 and then multiplying it by the number of the serially connected single cells is supplemented with the SOH, an average SOH may be added as another parameter to the expression (3) above that is rearranged into the following expression (6):

Battery pack charging voltage=serially connected single cell count×(average $OCV$+permissible charging current×average internal resistance value×average $SOH$)  (Exp. 6)

The battery pack charging voltage multiplied by the permissible charging current, both obtained as explained above, provides the permissible charging power.

Figure 11:
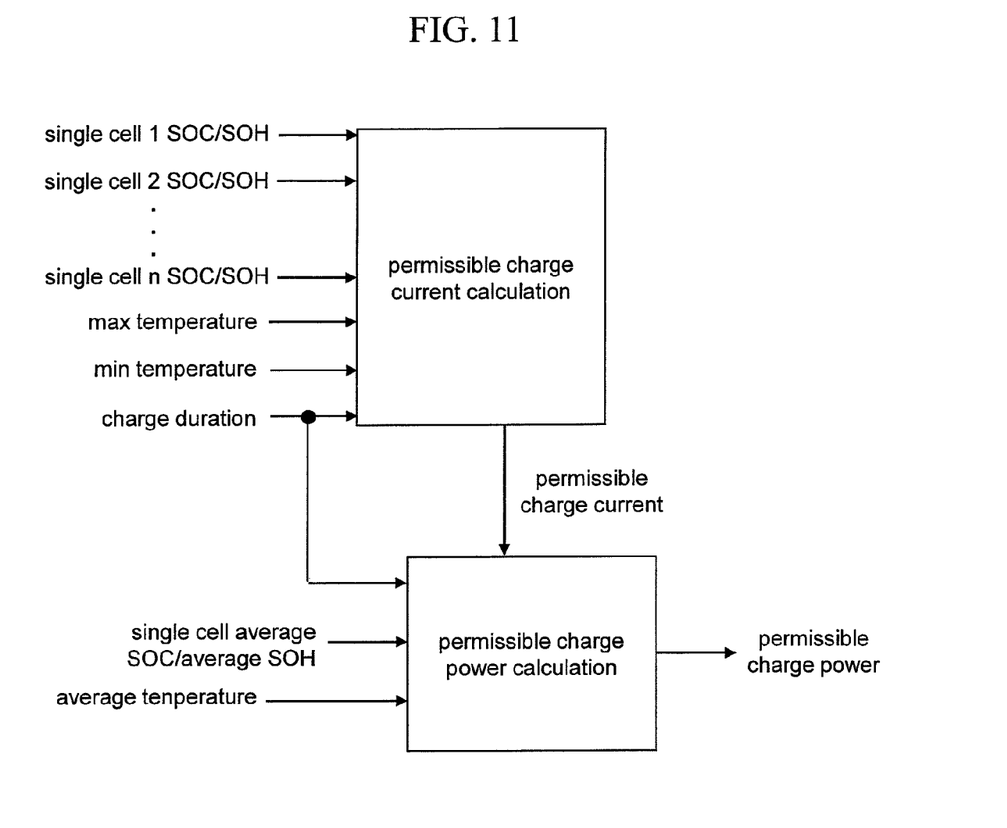
FIG. 11 is a chart showing in control blocks the method whereby the battery pack control unit 150 configured in the battery system 100 obtains the permissible charging power of the battery pack 110.

FIG. 11 shows an image of the process carried out to calculate the permissible charging current and the permissible charging power by using the expressions (5) and (6) above.

Where the sum of the voltage developed when the single cells 111 making up the battery pack 110 is each supplied with the corresponding permissible current is to be used as the battery pack charging voltage, the expression (6) above is not used. Alternatively, the SOC, SOH, temperature, and charging duration of each single cell 111 included in the battery pack 110 are inputted into the control block to calculate the voltage of each single cell 111 when charging it with the permissible charge current. The voltage thus obtained of the single cells 111 is then added up.

Whereas the preceding paragraphs discussed the permissible charging current and permissible charging power, a process similar to what was described above may also be performed in the case of discharging with the SOH taken into account. Specifically, replacing the parameter Vmax in the expression (5) above with Vmin allows the permissible discharging current to be obtained. Furthermore, replacing the permissible charging current in the expression (6) above with the permissible discharging current allows the permissible discharging power to be acquired.

With the third embodiment, SOC or SOH variation that may occur among the single cells 111 included in the battery pack 110 are taken into consideration when the permissible charging current or power, or the permissible discharging current or power is obtained and transmitted to the vehicle control unit 200. This puts the battery pack 110 under more secure charging and discharging control.

Although the invention proposed by the inventors has been explained using specific embodiments, these embodiments are not limitative of the present invention. It is evident that various modifications, variation, and alternatives may be made of the invention so far as they are within the scope of the appended claims or the equivalents thereof.

The structures, functions, and processing units explained above may each be implemented in part or in total either by hardware with suitable integrated circuit designs for example, or by software composed of programs whereby a processor realizes diverse functionality. The information such as programs and tables for implementing various functions may be stored in a storage device such as a memory and a hard disk or on a storage media such as IC cards and DVD's.

REFERENCE SIGNS LIST

100 Battery system
110 Battery pack
111 Single cell
112 Single cell group
120 Single cell management unit
121 Single cell control unit
122 Voltage detection circuit
123 Control circuit
124 Signal input/output circuit
125 Temperature detection unit
130 Current detection unit
140 Voltage detection unit
150 Battery pack control unit
160 Signal communication means
170 Insulating element
180 Storage unit
181 SOC table
182 Internal resistance table
200 Vehicle control unit
300-330 Relays
400 Inverter
410 Motor generator
420 Battery charger

The invention claimed is:

1. A battery control device comprising:
a control unit which controls a battery pack having a plurality of single cells connected therein;
a voltage measurement unit which measures voltage between terminals of the single cells or the battery pack;
a current measurement unit which measures a current flowing through the single cells or the battery pack;
a temperature measurement unit which measures a temperature of the single cells or the battery pack, and
a storage unit which stores internal resistance characteristic information indicative of correspondence relation between the temperature, state of charge, and either internal resistance value of the single cells or duration time during which the single cells are charged or discharged, wherein
the internal resistance characteristic information describes the correspondence relation regarding each of the duration time; wherein
the control unit acquires the state of charge of the single cells by using the result of the measurement by the voltage measurement unit and by the current measurement unit; wherein using the duration time that differs between an operation mode in to which to supply power to an electric vehicle and an operation mode in which to supply power to a hybrid vehicle, the control unit acquires the internal resistance value corresponding to the temperature, state of charge, and duration time of the single cells from the internal resistance characteristic information, and wherein the control unit uses an upper or lower voltage, an open circuit voltage, and the internal resistance value of the single cells to calculate a charging current or a discharging current of the single cells, the control unit further performing a control to charge or discharge the single cells in accordance with the charging current or the discharging current.

2. A battery control device according to claim 1, wherein the control unit switches the battery pack to either an operation mode in which to supply power to an electric vehicle or an operation mode in which to supply power to a hybrid vehicle, and wherein when the battery pack is operated in the operation mode in which to supply power to the electric vehicle, the control unit calculates the charging current or the discharging current of the single cells by using the internal resistance value corresponding to the duration time during which the single cells are charged or discharged.

3. A battery control device according to claim 1, wherein the control unit switches the battery pack to either an operation mode in which to supply power to an electric vehicle or an operation mode in which to supply power to a hybrid vehicle, and wherein when the battery pack is operated in the operation mode in which to supply power to the hybrid vehicle, the control unit calculates the charging current or the discharging current of the single cells by fixedly using the internal resistance value corresponding to one of the duration time.

4. A battery control device according to claim 1, wherein the control unit switches the battery pack to either an operation mode in which to supply power to an electric vehicle or an operation mode in which to supply power to a hybrid vehicle, and wherein when the battery pack is operated in the operation mode in which to supply power to the hybrid vehicle, the control unit calculates the charging current or the discharging current of the single cells by using the internal resistance value corresponding to duration time shorter than the duration time in effect when the battery pack is operated in the operation mode in which to supply power to the electric vehicle.

5. A battery control device according to claim 1, wherein the control unit calculates the charging current or the discharging current of the single cells by using the upper voltage or the lower voltage, the open circuit voltage, the internal resistance values of the single cells, and state of health of the single cells.

6. A battery control device according to claim 1, wherein the control unit calculates the charging current or the discharging current of the single cells using the internal resistance value obtained corresponding to the highest of the temperatures of the single cells, the control unit further calculating the charging current or the discharging current of the single cells by using the internal resistance value obtained corresponding to the lowest of the temperature of the single cells, the control unit further controlling the charging or discharging of the single cells by using the smaller of the two charging currents or of the two discharging currents of the single cells thus obtained.

7. A battery control device according to claim 1, wherein the control unit controls the charging or discharging of the single cells using the smallest of the charging current or of the discharging current of the single cells.

8. A battery control device according to claim 1, wherein the storage unit stores SOC characteristic information indicative of correspondence relation between the open circuit voltage and the state of charge of the single cells, and wherein the control unit acquires the current state of charge of the single cells using the open circuit voltage of the single cells and the SOC characteristic information.

9. A battery system comprising:

a battery control device according to claim 1, and a battery pack having a plurality of single cells connected therein, wherein the battery control device controls either the single cells or the battery pack.

* * * * *